United States Patent
Xiao

(10) Patent No.: US 9,029,222 B2
(45) Date of Patent: May 12, 2015

(54) THREE-DIMENSIONAL QUANTUM WELL TRANSISTOR AND FABRICATION METHOD

(71) Applicant: Semiconductor Manufacturing International (Shanghai) Corporation, Shanghai (CN)

(72) Inventor: De Yuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/144,623

(22) Filed: Dec. 31, 2013

(65) Prior Publication Data

US 2014/0203243 A1    Jul. 24, 2014

(30) Foreign Application Priority Data

Jan. 22, 2013    (CN) .......................... 2013 1 0024090

(51) Int. Cl.
| H01L 29/06 | (2006.01) |
| H01L 29/78 | (2006.01) |
| H01L 29/66 | (2006.01) |
| H01L 29/778 | (2006.01) |
| H01L 29/51 | (2006.01) |
| H01L 29/20 | (2006.01) |

(52) U.S. Cl.
CPC ........ *H01L 29/785* (2013.01); *H01L 29/66795* (2013.01); *H01L 29/517* (2013.01); *H01L 29/66462* (2013.01); *H01L 29/7783* (2013.01); *H01L 29/7789* (2013.01); *H01L 29/0657* (2013.01); *H01L 29/2003* (2013.01)

(58) Field of Classification Search
USPC ............................................. 257/24; 438/283
See application file for complete search history.

(56) References Cited

U.S. PATENT DOCUMENTS

| 2005/0133816 A1 | 6/2005 | Fan et al. | |
| 2014/0203243 A1* | 7/2014 | Xiao | 257/24 |
| 2014/0353715 A1* | 12/2014 | Xiao | 257/190 |

* cited by examiner

*Primary Examiner* — Jami M Valentine
(74) *Attorney, Agent, or Firm* — Anova Law Group, PLLC

(57) ABSTRACT

Three dimensional quantum well transistors and fabrication methods are provided. A quantum well layer, a barrier layer, and a gate structure can be sequentially formed on an insulating surface of a fin part. The gate structure can be formed over the barrier layer and across the fin part. The QW layer and the barrier layer can form a hetero-junction of the transistor. A recess can be formed in the fin part on both sides of the gate structure to suspend a sidewall spacer. A source and a drain can be formed by growing an epitaxial material in the recess and the sidewall spacer formed on both sidewalls of the gate electrode can be positioned on surface of the source and the drain.

11 Claims, 11 Drawing Sheets

THREE-DIMENSIONAL QUANTUM WELL TRANSISTOR AND FABRICATION METHOD

CROSS-REFERENCES TO RELATED APPLICATIONS

This application claims priority to Chinese Patent Application No. 201310024090.3, filed on Jan. 22, 2013, the entire contents of which are incorporated herein by reference.

FIELD OF THE DISCLOSURE

The present disclosure relates to the field of semiconductor technology and, more particularly, relates to three-dimensional quantum well (3D-QW) transistors and fabrication methods.

BACKGROUND

In a typical MOS device, a channel region is formed by doping the semiconductor substrate with impurities. The channel region may have both majority carriers and ionized impurities. The majority carriers may be scattered by the ionized impurities during a migration process. The mobility of carriers and the device performance can be reduced. As dimensions of semiconductor devices continue to shrink, short-channel effect may seriously affect device performance.

High electron mobility transistors (HEMTs) have a channel region formed by a hetero-junction. The hetero-junction is formed by an undoped quantum well (QW) layer and a barrier layer on the undoped QW layer. Two-dimensional electron gas may be formed in the QW layer and may be migrated in a horizontal plane. The two-dimensional electron gas is used as carriers of the transistor. Because the QW layer is undoped, the two-dimensional electron gas is not affected by the scattering of the ionized impurities, which provides high mobility to the carriers. Device performance is effectively improved with reduced short channel effects and reduced threshold voltage.

For HEMTs, however, the gate may have less or weak control on the extended area of the channel region under the sidewall spacer of the gate, which may result in a non-uniform density of the two-dimensional electron gas in the channel region with high resistance in the channel region and with reduced device performance.

BRIEF SUMMARY OF THE DISCLOSURE

One aspect of present disclosure includes a method of forming a transistor. A buffer layer is formed on the semiconductor substrate. A fin part is formed by etching the buffer layer and the fin part is formed of an insulating material. An insulating layer is formed on the semiconductor substrate having a top surface lower than a top surface of the fin part. A QW layer is formed on surface of the fin part and a barrier layer is formed on surface of the QW layer. A gate structure is formed on the barrier layer across the fin part and on the insulating layer. The gate structure includes a gate dielectric layer on each of the insulating layer and the barrier layer, and a gate electrode on the gate dielectric layer. A sidewall spacer is formed on both sidewalls of the gate structure, followed by forming a recess in the fin part on both sides of the gate structure to suspend the sidewall spacer. A source and a drain are then formed by growing an epitaxial material in the recess. Each of the source and the drain includes a side edge aligned with a sidewall edge of the gate structure such that a channel region in the QW layer under the gate structure having a same width with the gate structure and the channel region does not extend to under the sidewall spacer.

Another aspect of present disclosure includes a transistor. The transistor includes a fin part and an insulating layer each disposed on a semiconductor substrate, the insulating layer having a top surface lower than a top surface of the fin part. The transistor includes a quantum well (QW) layer disposed on the fin part and a barrier layer disposed on the QW layer. A gate structure is disposed on the barrier layer across the fin part and on the insulating layer. The gate structure includes a gate dielectric layer on each of the insulating layer and the barrier layer, and a gate electrode on the gate dielectric layer. A source and a drain are disposed on both sides of the gate structure and within the fin part. Each of the source and the drain has a side edge aligned with a sidewall edge of the gate structure. The transistor further includes a sidewall spacer disposed on both sidewalls of the gate electrode and on surface of each of the source and the drain such that a channel region in the QW layer under the gate structure having a same width with the gate structure and the channel region does not extend to under the sidewall spacer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Three-dimensional quantum well (3D-QW) transistors and methods of forming the 3D-QW transistors are provided. On an insulating surface of a fin part formed from a buffer layer, a QW layer, a barrier layer, and a gate structure can be sequentially formed. The gate structure can be formed on the barrier layer and across the fin part. The QW layer and the barrier layer can form a hetero-junction of the transistor across the fin part. The disclosed transistors and fabrication methods can reduce resistance of the transistor channel region, improve the source-drain current, and increase the thermal stability of the transistor.

Figure 23:
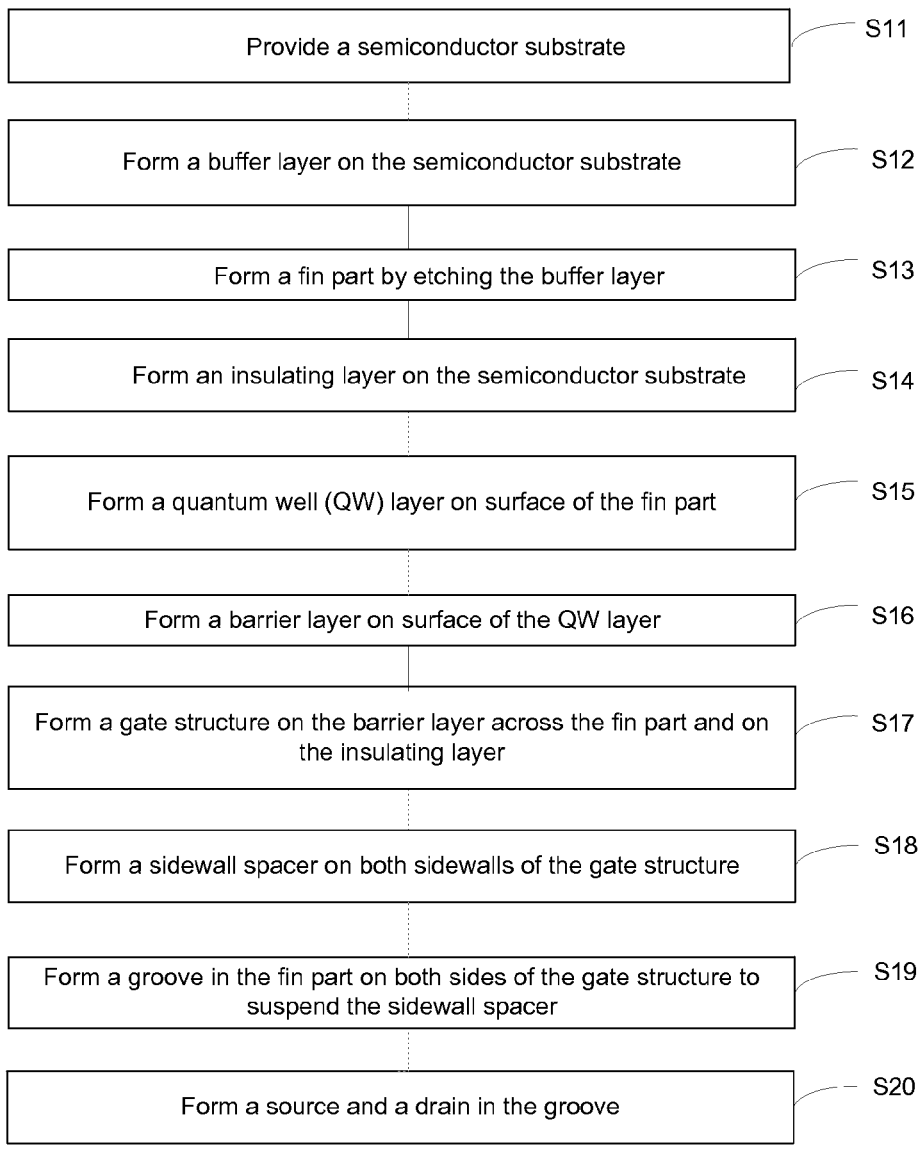
FIG. 23 depicts an exemplary method for forming a 3D-QW transistor in accordance with various disclosed embodiments.

FIG. 23 depicts a flowchart of an exemplary method for forming a transistor consistent with the disclosed embodiments, and FIGS. 1-21 depict an exemplary transistor corresponding to certain stages during its formation in accordance with various disclosed embodiments.

Figure 1:
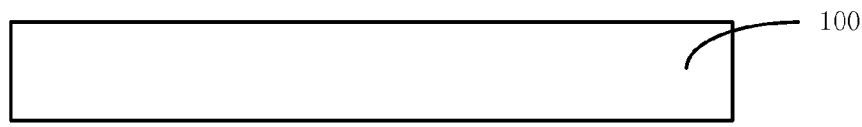
FIGS. 1-21 depict an exemplary three-dimensional quantum well (3D-QW) transistor at various stages during its formation in accordance with various disclosed embodiments.

Referring to FIG. 1, a semiconductor substrate 100 is provided (Step S11).

The semiconductor substrate 100 can be made of a material including, e.g., silicon, germanium, silicon germanium, silicon carbide, gallium arsenide, and/or other suitable semiconductor materials. The semiconductor substrate 100 can include a composite structure such as silicon on insulator (SOI). Suitable materials and structures can be selected for the semiconductor substrate 100, depending on desired semiconductor devices (including e.g., the 3D-QW transistor to be formed and/or other possible devices) to be formed on the semiconductor substrate 100. The type of the semiconductor substrate is not limited herein.

In one embodiment, the semiconductor substrate 100 can be a silicon substrate. The exemplary silicon substrate can have a crystal plane (111). The crystal plane (111) of the silicon substrate can have a lattice constant and/or a lattice structure same or similar to the buffer layer to be subsequently formed. This can facilitate high quality epitaxial growth of the buffer layer.

Figure 2:
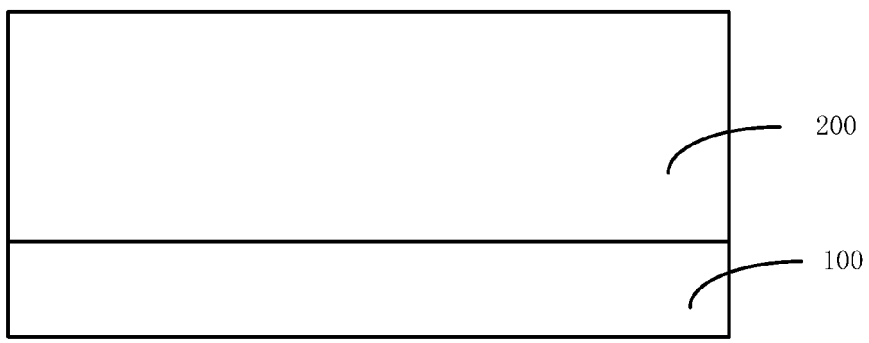

Referring to FIG. 2, a buffer layer 200 is formed on surface of the semiconductor substrate 100 (Step S12).

In this embodiment, the buffer layer 200 can be made of a material including, e.g., AlN. The buffer layer 200 can have a thickness ranging from about 1 micron to about 2 microns. The buffer layer 200 can be formed by a process including, e.g., a metal organic chemical vapor deposition, an atomic layer deposition, a molecular beam epitaxy, etc.

The buffer layer 200 can include an undoped AlN as a desired insulator to isolate the semiconductor devices from the semiconductor substrate. AlN buffer layer can have high thermal conductivity of about 3.4 W/cmK to more easily introduce heat generated by the semiconductor devices into the semiconductor substrate and thus to improve thermal stability of the semiconductor devices.

Moreover, the buffer layer 200 can be configured between the semiconductor substrate 100 and a subsequently-formed QW layer. The silicon substrate is an indirect band gap semiconductor, and the subsequently-formed QW layer can be a direct band gap semiconductor. The silicon substrate and the subsequently-formed QW layer can be lattice-mismatched. The lattice constant of an AlN material is between lattice constants of the silicon substrate and the QW layer. The AlN buffer layer can provide a lattice basis for a subsequent growth of the QW layer.

In one embodiment, the buffer layer can be formed with higher quality on the crystal plane (111) of the silicon substrate because the lattice constant of the silicon substrate is relatively close to the lattice constant of the AlN buffer layer. The buffer layer with higher quality can allow less defects to be formed to a fin part during a subsequent etching of the buffer layer. Deposition quality of the QW layer on the fin part can thus be improved.

Figure 3:
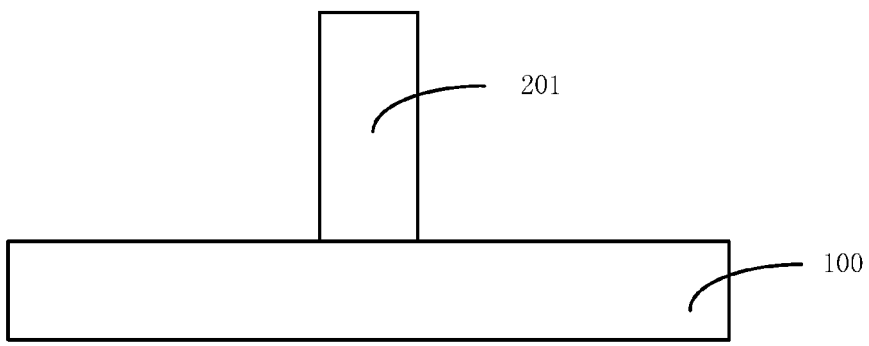

Referring to FIG. 3, the buffer layer 200 is etched to form a fin part 201 (Step S13). The fin part 201 can be formed by, e.g., a plasma etching. The fin part 201 can have a height the same as or less than a thickness of the buffer layer 200. The fin part 201 can have a height ranging from about 1 micron to about 2 microns.

Figure 4:
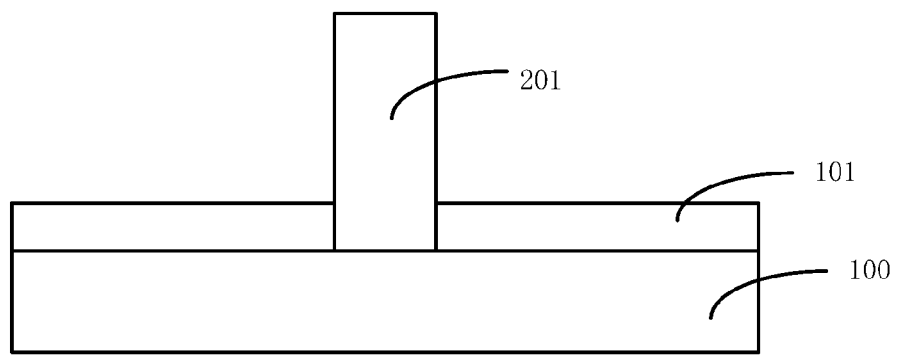

Referring to FIG. 4, an insulating layer 101 is formed on the semiconductor substrate 100 (Step S14).

In one embodiment, the insulating layer 101 can be made of a material including, e.g., silicon oxide. The insulating layer 101 can have a thickness of about 50 nm to about 500 nm. In one embodiment, a thermal oxidation method can be used to oxidize the exposed surface of the semiconductor substrate 100 (i.e., not covered by the fin part 201) to form a silicon oxide layer thereon as the insulating layer 101. The insulating layer 101 can be used as an isolation structure between a subsequently formed gate structure and the semiconductor substrate. In other embodiments, a wet oxidation method can be used to form the insulating layer 101.

Figure 5:
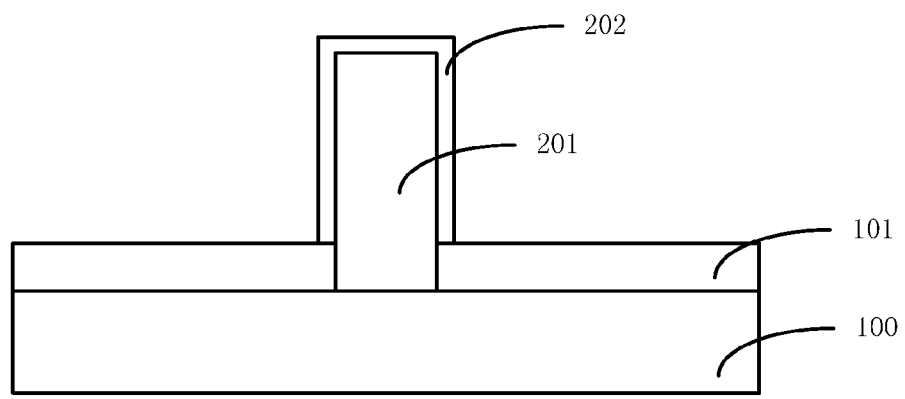

Referring to FIG. 5, a QW layer 202 is formed on surface of the fin part 201 (Step S15).

The QW layer 202 can be made of a material including group III-V and/or group II-VI materials. For example, the QW layer 202 can be made of a material including, e.g., GaN, AlGaN, InGaN, Ge, and/or other suitable materials. The QW layer 202 can have a thickness ranging from about 10 nm to about 100 nm.

The QW layer 202 can be formed by a process including, e.g., a metal-organic chemical vapor deposition, an atomic layer deposition, a molecular beam epitaxy, etc. The fin part 201 can be made of a material including, e.g., AlN. The fin part 201 can be made of a single crystal material having a lattice structure, while the QW layer 202 can also be made of a semiconductor material having a lattice structure. The QW layer 202 can therefore be selectively formed on the surface of the fin part 201. The QW layer 202 is not formed on the surface of the insulating layer 101.

Figure 6:
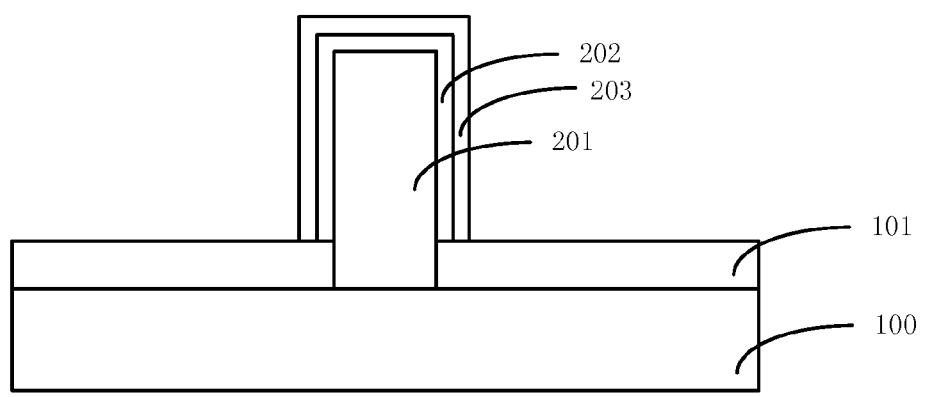

Referring to FIG. 6, a barrier layer 203 is formed on surface the QW layer 202 (Step S16).

The barrier layer 203 can be made of a material including, e.g., AlN, AlGaN and/or AlInN. The barrier layer 203 can have a thickness ranging from about 1 nm to about 10 nm. The barrier layer 203 can be formed by a process including, e.g., a metal-organic chemical vapor deposition, an atomic layer deposition, a molecular beam epitaxy process, etc. For example, the barrier layer 203 can be made of AlInN. The barrier layer 203 can be selectively formed on surface of the QW layer 202.

The barrier layer 203 and the QW layer 202 can form a hetero-junction structure. The barrier layer 203 can have an energy bandgap greater than the QW layer 202 to form a large energy band offset on the junction surface and to form strong polarization effect between the barrier layer 203 and the QW layer 202. The QW layer can be used as a non-doped narrow-bandgap channel layer.

A potential well can be formed on surface area of the QW layer 202 near the barrier layer 203. Electrons can move from the barrier layer 203 into the QW layer 202 but be limited within the potential well at the junction surface between the QW layer 202 and barrier layer 203. Electrons can only be free to move in a plane parallel to the junction plane but be limited to move in a vertical direction to the junction plane, thereby forming a two-dimensional electron gas.

Because the QW layer 202 is undoped, the two-dimensional electron gas in the potential well is not subject to the scattering of the ionized impurities and thus has a high mobility. By controlling the gate voltage of subsequently formed gate structure, the depth of the potential well of the hetero-junction structure can be controlled, thereby controlling surface density of the two-dimensional electron gas in the potential well and controlling the operating current of the transistor.

Figure 7:
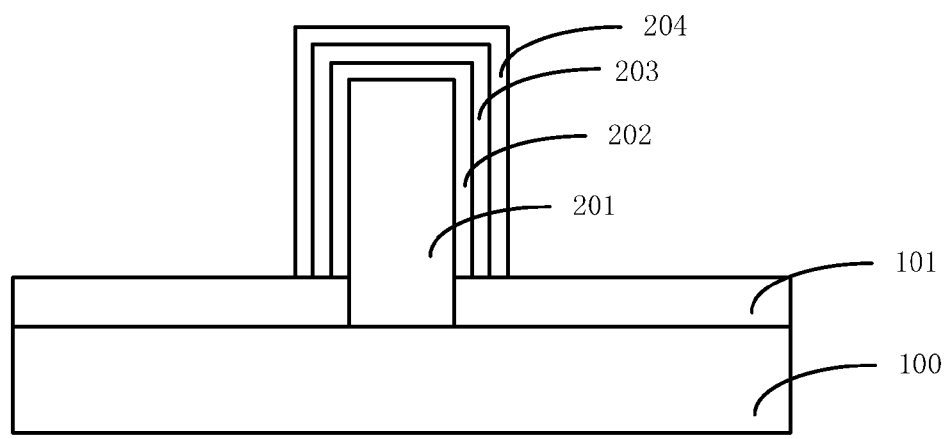

Referring to FIG. 7, a capping layer 204 is formed on the surface of the barrier layer 203.

For example, the cap layer 204 can be made of a material including, e.g., GaN or AlGaN. The capping layer 204 can have a thickness ranging from about 1 nm to 3 nm. For example, the cap layer 204 can be made of GaN. The capping layer 204 can be formed by a process including, e.g., a metal-organic chemical vapor deposition, an atomic layer deposition, or a molecular beam epitaxy, etc. The formed capping layer 204 can reduce the gate leakage current and increase the breakdown characteristics of the transistor. In other embodiments, the capping layer 204 may not be formed.

Figure 8:
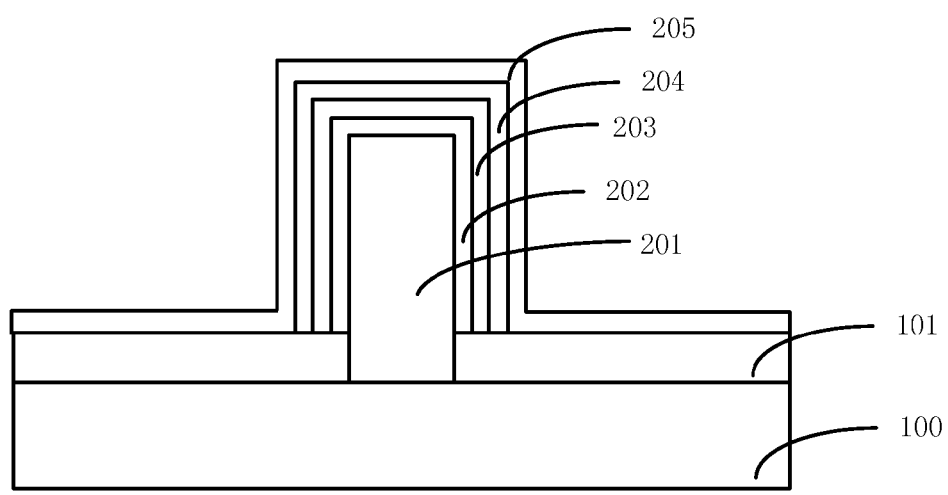

Referring to FIG. 8, a gate dielectric material 205 is formed on surface of the cap layer 204 and on the insulating layer 101 (Step S17).

The gate dielectric material 205 can include high-K dielectric materials including, e.g., $SiO_2$, $ZrO_2$, $Al_2O_3$, $HfO_2$, $HfSiO_4$, $La_2O_3$, HfSiON and/or $HfAlO_2$. The gate dielectric material 205 can have a thickness ranging from about 1 nm to 5 nm, for example, from about 1 nm to about 3 nm.

The gate dielectric material 205 can be formed by a process including, e.g., a metal-organic chemical vapor deposition, an atomic layer deposition, or a molecular beam epitaxy process. In other embodiments where the cap layer 204 is not formed, the gate dielectric material 205 can be formed directly on surface of the barrier layer 203.

Figure 9:
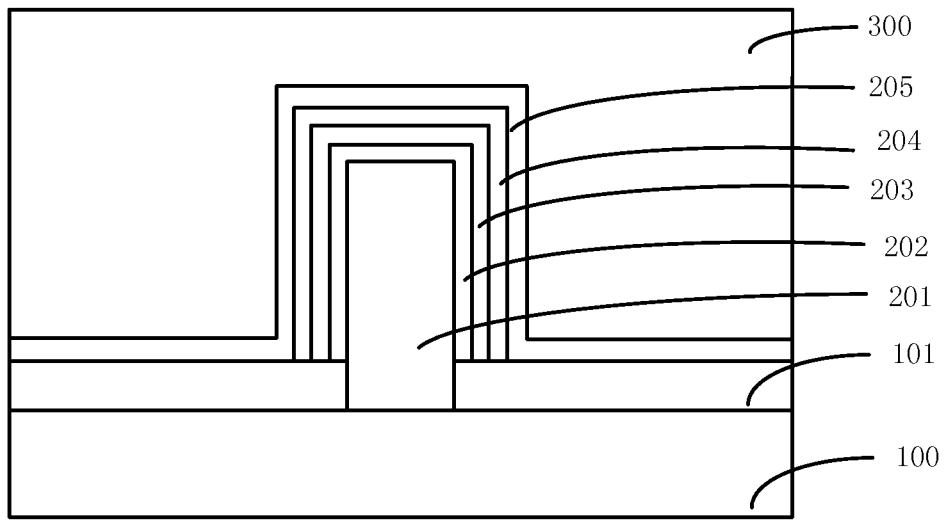

Referring to FIG. 9, a gate metal layer 300 is formed on surface of the gate dielectric material 205 (Step S17).

The gate metal layer 300 can be made of a material including, e.g., NiAu and/or CrAu. The gate metal layer 300 can be formed by, e.g., a chemical vapor deposition or a sputtering process. In some cases, a chemical mechanical polishing process can be included to planarize surfaces.

Figure 10:
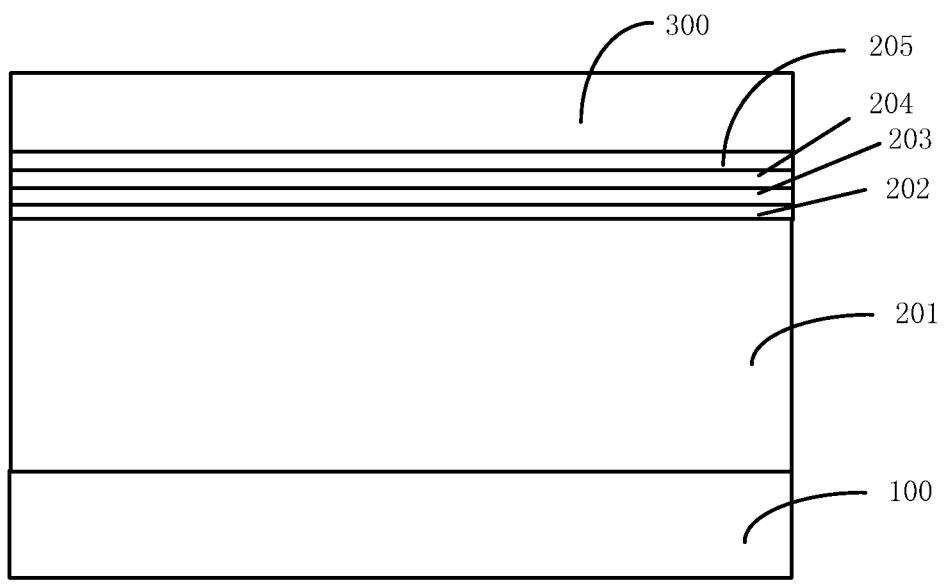

FIG. 10 depicts a cross-sectional view of the transistor in FIG. 9 along a length (or longitudinal) direction of the fin part 201 after formation of the gate metal layer 300.

Figure 11:
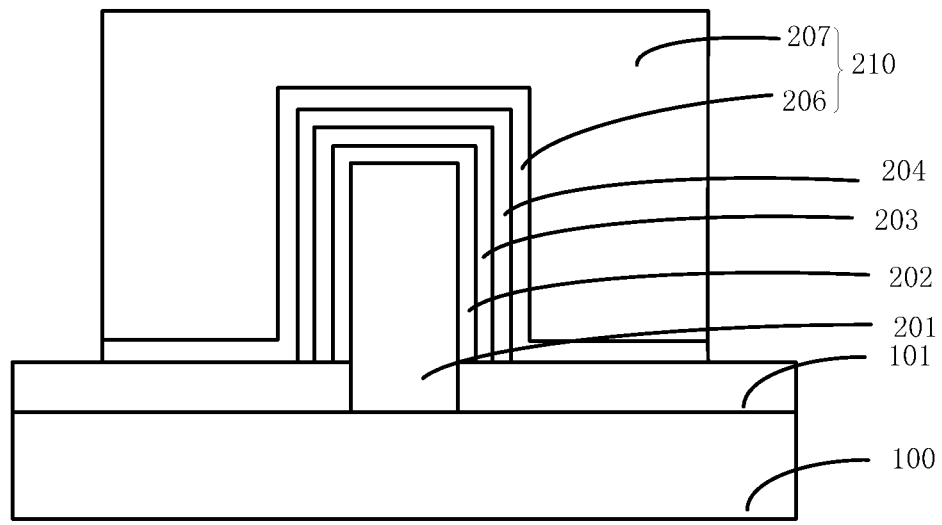

Referring to FIG. 11, the gate metal layer 300 and the gate dielectric material 205 are etched to form a gate structure 210. Thus, the gate structure 210 includes a gate dielectric layer 206 and a metal gate electrode 207 as shown in FIG. 11.

For example, the gate structure 210 can be formed by first forming a patterned mask layer on the gate metal layer 300, the patterned mask layer covering a position for forming the gate structure 210; and using the patterned mask layer as an etch mask to dry etch the gate metal layer 300 and the gate dielectric material 205 to form the metal gate electrode 207 and the gate dielectric layer 206. The gate dielectric layer 206 can expose a surface portion of the insulating layer 101. The gate structure 210 can be formed on the surface of the cap layer 204 and across the fin part 201.

Figure 12:
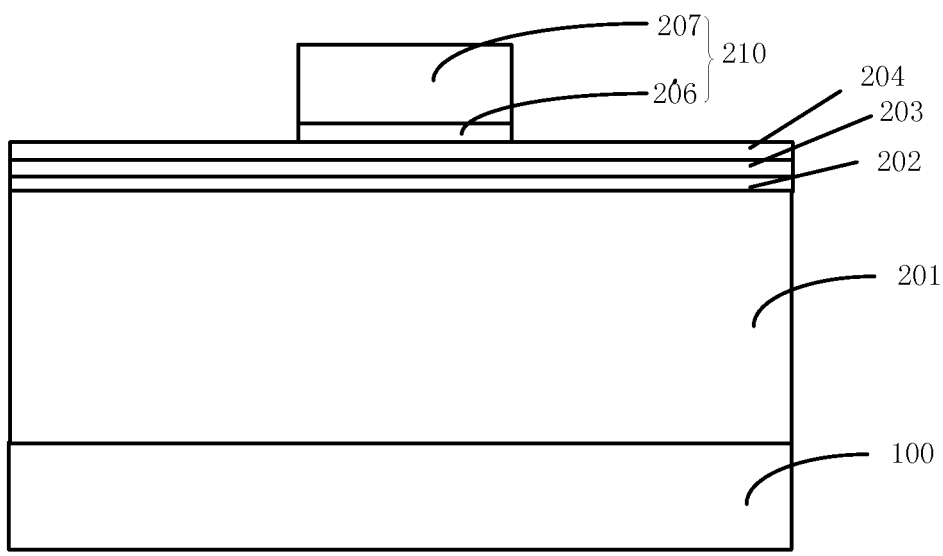

FIG. 12 depicts a cross-sectional view of the transistor in FIG. 11 along a length (or longitudinal) direction of the fin part 201 after forming the gate structure 210. As shown, after etching to form the gate structure 210, a portion of the cap layer 204 on both sides of the gate structure 210 and on the surface of the fin part 201 can be exposed.

Figure 13:
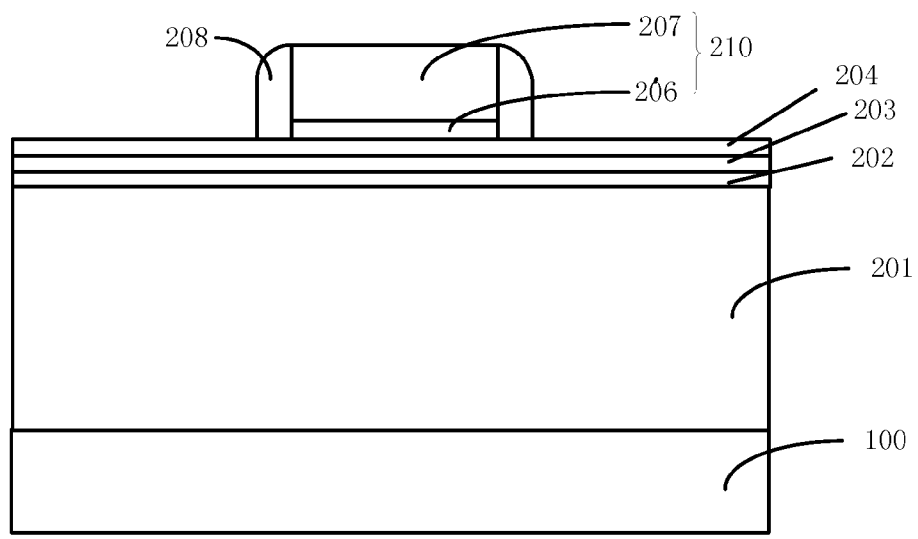

FIG. 13 depicts a cross-sectional view of the transistor along a length (or longitudinal) direction of the fin part 201. As shown in FIG. 13, a sidewall spacer 208 is formed on both sidewalls of the gate structure 210 (Step S18).

The sidewall spacer 208 can be made of a material including, e.g., silicon nitride. The sidewall spacer 208 can protect the metal gate electrode 207 and the gate dielectric layer 206 during a subsequent process for forming a source/drain.

Figure 14:
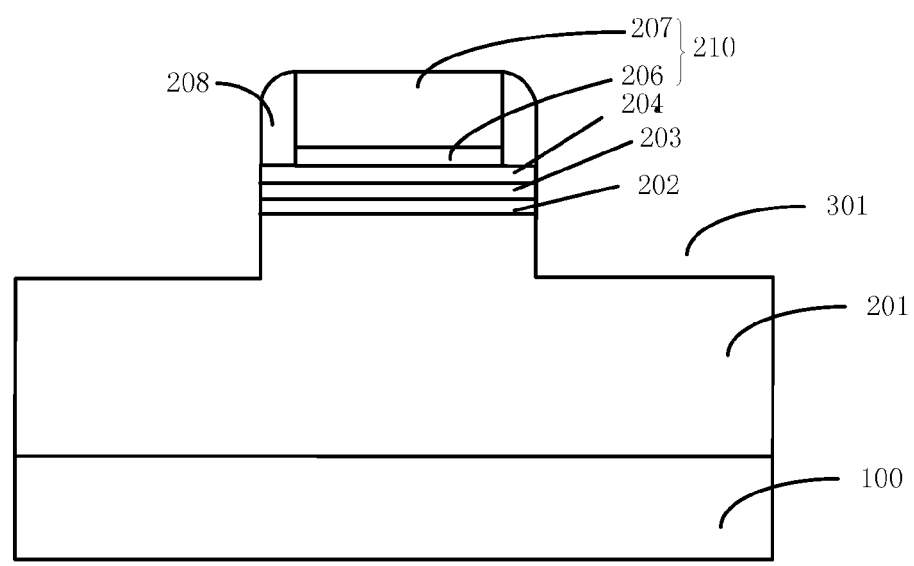

Referring to FIG. 14, a recess 301 is formed within the fin part 201 at both sides of the gate structure 210 and the sidewall spacer 208 (Step S19).

For example, the recess 301 can be formed by: using the gate structure 210 and the sidewall spacer 208 as a mask to sequentially etch the capping layer 204, the barrier layer 203, the QW layer 202, and/or a portion of the fin part 201 to form the recess 301. The etching process can include a dry etching process such as a plasma etching process using $BCl_3$ as plasma source.

Figure 15:
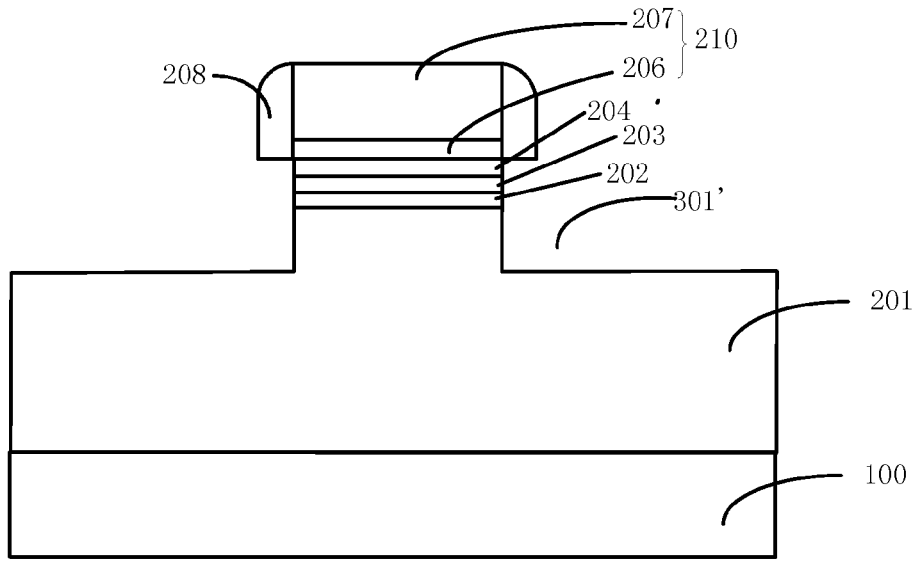

Referring to FIG. 15, a recess 301' is formed by removing a portion of each of: the cap layer 204, the barrier layer 203, the QW layer 202, and/or the fin part 201, under the sidewall spacer 208 to suspend the sidewall spacer 208 over the fin part 201. For example, the method for suspending the sidewall spacer 208 can include a wet etching.

In one embodiment, diaminoethane can be used in an etching solution to remove a portion of the barrier layer 203 made of AlInN under the sidewall spacer. NaOH solution having a molar concentration of about 30% to about 50% can be used as an etching solution to remove a portion of each of the QW layer 202 and the cap layer 204 that are made of GaN under the sidewall spacer. HF solution can be used to remove a portion of the fin part 201 made of AlN under the sidewall spacer. The use of wet etching solution can provide a simple process without assistance from photolithography and can selectively remove materials of each portion under the sidewall spacer 208.

The recess 301' can be used as a source/drain recess region for forming source/drain therein. The buffer layer is partially etched.

Figure 16:
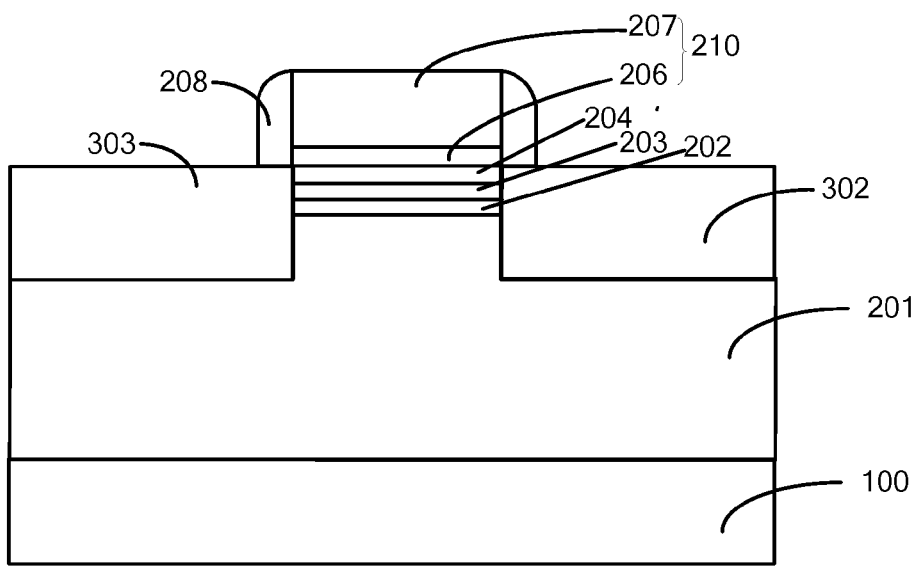

Referring to FIG. 16, a source 302 and a drain 303 can be formed, e.g., re-grown, in the recess 301' (Step S20).

The two-dimensional (2D) electron gas in the QW layer 202 of the transistor can be used as a carrier. When the source 302 and the drain 303 are doped with N-type dopants, an N-type transistor can be formed. For example, the source 302 and the drain 303 can be made of a material including, e.g., N-doped GaN. The source 302 and drain 303 can be made of a method including a metal organic chemical vapor deposition, an atomic layer deposition, or a molecular beam epitaxy processes.

For example, after a GaN layer is grown in the recess 301', the GaN layer can be doped with N-type ions to form an N-type doped GaN layer as the source 302/drain 303 of the transistor. In other embodiments, an in-situ doping process can be used to dope the N-type dopants to form the source 302 and the drain 303, whiling forming the GaN layer.

In one embodiment, because the fin part 201 can be made of a material including, e.g., AlN, which is difficult to be doped, a recess can be formed first in the fin part 201 at both sides of the gate structure 210 and then an epitaxial semiconductor material that is easily to be doped can be grown within the recess to form the source and the drain. As a semiconductor material, GaN can be easily doped. In addition, because AlN has fixed or regular lattice structure, selective epitaxy can be used to grow the GaN layer in the recess and to dope the GaN layer to form the source 302 and the drain 303.

The sidewall spacer 208 can be positioned having a bottom surface on the source 302 and on the drain 303 such that the QW layer 202 and barrier layer 203 can form a hetero-junction region having a width to be used as a channel region of the transistor. Such width of the hetero-junction region (or the channel region) can be the same as a width of the gate structure 210. When a gate voltage is applied to the gate structure 210, by adjusting the gate voltage, the density of the two-dimensional electron gas in the channel region under the gate structure 210 can be controlled, thereby controlling the work current of the transistor.

The channel region under the gate structure 210 can be affected by the gate voltage. When the gate voltage is greater than a threshold voltage, the two-dimensional electron gas of the channel region can have a uniform density to provide the channel region with a low resistance.

In a case when the disclosed wet etching process is not used to suspend the sidewall spacer 208 on both sides of the gate structure, a hetero-junction structure can be formed under the non-suspended sidewall spacer, which can be used as an extended region of the channel region. Because no biased voltage can be applied to the non-suspended sidewall spacer, the extended region of the channel region under the non-suspended sidewall spacer can have a two-dimensional electron gas with a density less than the density of the two-dimensional electron gas in the channel region 210 exactly beneath the gate structure.

As such, the extended region of the channel region exactly under the non-suspended sidewall spacer can have a great resistance and thus the entire channel region (including the extended region) can have a reduced average density of the electron gas. This reduces the source-drain current of the transistor. In this manner, the removal of the extended region of the channel region under the sidewall spacer can reduce resistance of the channel region and increase the source-drain current of the transistor. No underlap or overlap can be generated between the gate and the source/drain, due to the removal of the extended region of the channel region under the sidewall spacer.

Figure 17:
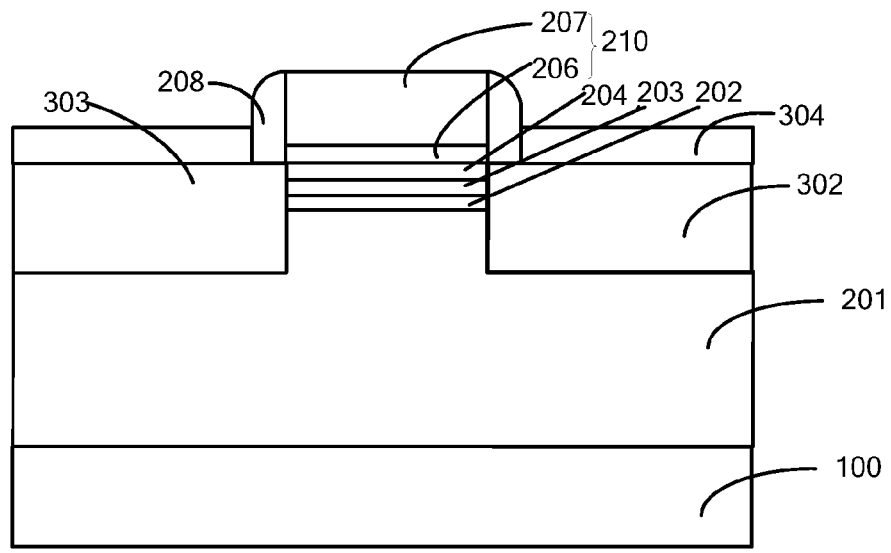

Referring to FIG. 17, a metal electrode 304 can be formed on the source 302 and the drain 303.

The metal electrode 304 can be made of a material including, e.g., NiAu and/or CrAu. The metal electrode 304 can be formed by, e.g., a sputtering process or an evaporation process. The metal electrode 304 may reduce a contact resistance of the source 302 and the drain 303.

Figure 18:
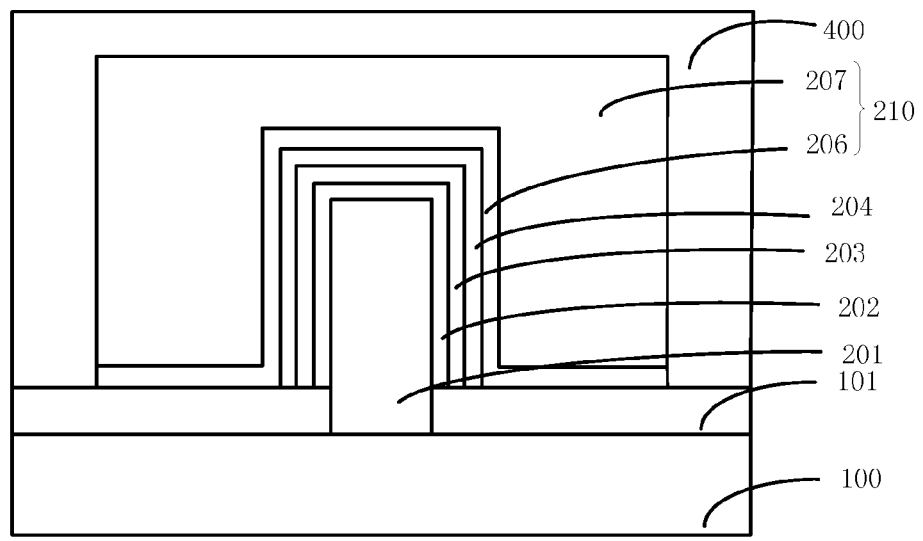

Referring to FIG. 18, an interlayer dielectric layer 400 is formed on the metal gate electrode 207 and the insulating layer 101. FIG. 18 shows a cross sectional view of the transistor along a direction perpendicular to a length of the fin part.

The interlayer dielectric layer 400 can be made of a material including, e.g., an insulating dielectric material such as silicon oxide, phosphorus-doped silicon oxide, boron-doped silicon oxide, and/or boron phosphorus-doped silicon oxide.

Figure 19:
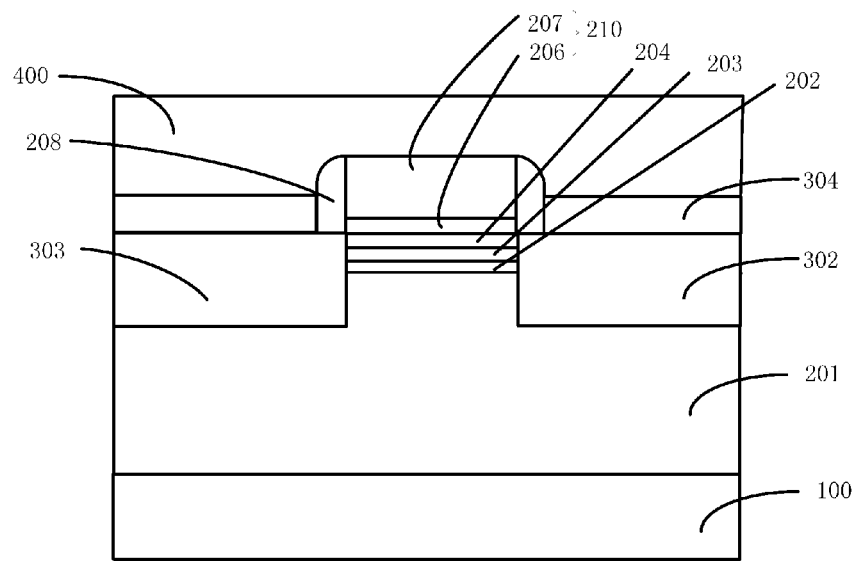

FIG. 19 depicts a cross-sectional view of the transistor along a direction perpendicular to a length of the fin part 201, after forming the interlayer dielectric layer 400. As shown, the inter-layer dielectric layer 400 can cover the sidewall spacer 208 and the metal electrode 304 on each of the source 302 and the drain 303.

For example, the interlayer dielectric layer 400 can be formed by a process including, e.g., a chemical vapor deposition. After depositing an interlayer dielectric material on surface of the metal gate electrode 207, the insulating layer 101, the sidewall spacer 208, and the metal electrode 304, a chemical mechanical polishing process can be performed to planarize the entire surface and to form the interlayer dielectric layer 400.

Subsequently, a metal interconnect structure can be formed on surface of the interlayer dielectric layer 400 to connect the semiconductor device (not shown) with the metal interconnect structure.

Figure 20:
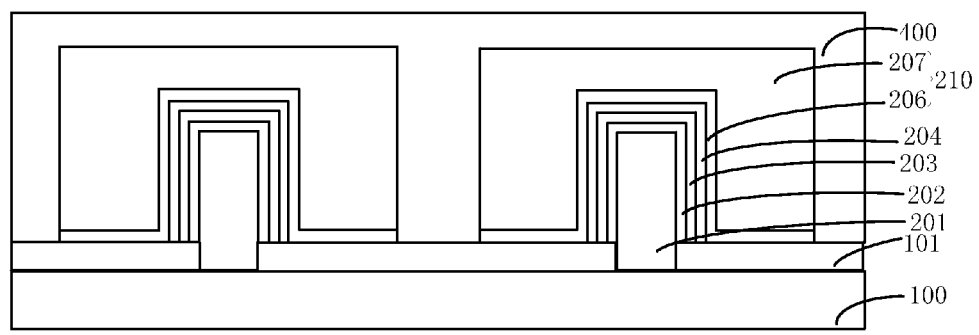
Figure 21:
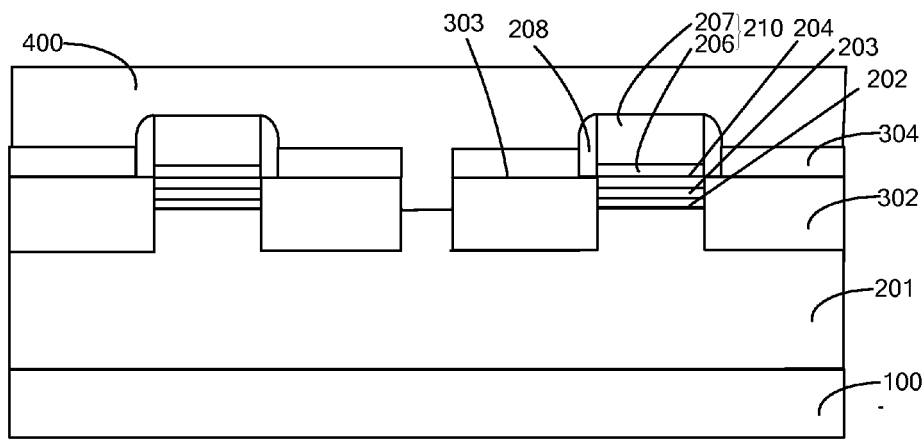

FIGS. 20-21 depict various exemplary transistors each including multiple 3D-QW transistors. Note that although two 3D-QW transistors are illustrated in FIGS. 20-21, one of ordinary skill in the art would appreciate that any desired number of 3D-QW transistors can be formed on the substrate 100 as shown in FIGS. 20-21.

For example, FIG. 20 depicts an exemplary transistor including two 3D-QW transistors simultaneously formed on adjacent different fin parts and over the semiconductor substrate 100. The cross-sectional view of the exemplary transistor in FIG. 20 is along a direction perpendicular to a length of the fin parts.

As shown in FIG. 20, two fin parts 201 can be simultaneously formed from a buffer layer on a semiconductor substrate. According to the method described above in FIGS. 1-18, a 3D-QW transistor can be formed on each of the two fin parts. During the formation, when etching a gate metal layer 300 and a gate dielectric material 205 to form a gate structure 210 (e.g., as shown in FIG. 9), an etching process can be performed to etch materials of the gate metal layer and the gate dielectric material between the two transistors to expose an insulating layer 101 to isolate the two transistor gate structures. An interlayer dielectric layer transistor 400 can then be formed on the transistor and on the insulating layer to cover surfaces thereof. Because all of the interlayer dielectric layer 400, the insulating layer 101, and the fin parts 201 are formed of insulating material(s), no additional isolation structures (e.g., shallow trench isolation structure) are needed for electrical isolation between the two transistors.

FIG. 21 depicts an exemplary transistor including two 3D-QW transistors simultaneously formed on a same fin part and over the semiconductor substrate 100. The cross-sectional view of the exemplary transistor in FIG. 21 is along a length direction of the fin part.

By using the above-described method as depicted in FIGS. 1-18, two or more 3D-QW transistors can be simultaneously formed on the fin part 201. Adjacent two 3D-QW transistors can be spaced apart. After the formation of adjacent 3D-QW transistors, a portion of each of the QW layer, the barrier layer, and/or the capping layer between the two transistors on surface of the fin part 201 can be removed to form an interlayer dielectric layer 400 on the fin part between the adjacent transistors. The two transistors formed on the same fin part are connected at the bottom by the fin part 201 that is formed by insulating materials. A portion of the fin part can also further isolate the two 3D-QW transistors. No additional isolation structures are therefore needed.

In conventional methods for forming transistors, additional isolation structures have to be formed, e.g., using silicon oxide as the isolation dielectric material. Silicon oxide has a thermal conductivity of about 0.014 W/cmK. Such low thermal conductivity can affect heat transfer from the transistors over the substrate to the substrate. As disclosed, 3D-QW transistor can be formed on the fin part 201. The gate structure can be formed having a sufficient contact area with the fin part to effectively improve an area of the channel region of the transistor and to improve a gate length of the gate structure. Transistor performance can thus be improved and heat dissipation efficiency of the transistor can be improved. In addition, insulting materials such as AlN can be used as the fin part. The exemplary AlN material can have a thermal conductivity of about 3.4 W/cmK, which has two orders of magnitude higher than the conventionally used silicon oxide. The use of the fin part as an isolation medium can facilitate heat transfer from the transistors configured on the semiconductor substrate to the semiconductor substrate to improve stability of the 3D-QW transistor.

An exemplary 3D-QW transistor is also provided herein. For example, referring back to FIG. 18, a 3D-QW transistor can include a semiconductor substrate 100; an insulating fin part 201 and an insulating layer 101 formed on surface of the semiconductor substrate 100, the insulating layer 101 having a top surface lower than the top surface of the fin part 201; a QW layer 202 formed on surface of the fin part 201; a barrier layer 203 formed on the QW layer 202; and gate structure 210 formed on the barrier layer 203 and across the fin part, the gate structure 210 including a gate dielectric layer 206 over the barrier layer and a gate electrode 207 on the gate dielectric layer. The 3D-QW transistor can further include an interlayer dielectric layer 400.

In one embodiment, the semiconductor substrate 100 can include a silicon substrate having a crystal plane (111). The fin part 201 can be made of a material of AlN having a height ranging from about 1 micron to about 2 microns. The insulating layer can have a thickness ranging from about 50 nm to about 500 nm and can be made of a material of silicon oxide.

The QW layer 202 can have a thickness ranging from about 10 nm to about 100 nm and can be made of a material from group III-V and/or group II-VI. The QW layer 202 can be made of GaN, AlGaN, InGaN, and/or Ge.

The barrier layer 203 can have a thickness ranging from about 1 nm to about 10 nm, and can be made of AlN, AlGaN, and/or AlInN. The fin part 201 can be made of a material of AlN and can have a height ranging from about 1 micron to about 2 microns. The insulating layer can have a thickness ranging from about 50 nanometers to 500 nanometers and can be made of a material of silicon oxide.

In one embodiment, a capping layer 204 can be disposed between the gate structure 210 and the barrier layer 203. The capping layer 204 can have a thickness ranging from about 1 nm to about 3 nm. The capping layer 204 can be made of a material of GaN. In other embodiments, the disclosed transistor can be formed without the capping layer 204.

The gate dielectric layer 206 can have a thickness ranging from about 1 nm to about 5 nm and can be made of a material including, e.g., $SiO_2$, $ZrO_2$, $Al_2O_3$, $HfO_2$, $HfSiO_4$, $La_2O_3$, HfSiON and/or $HfAlO_2$.

Referring back to FIG. 19, another exemplary 3D-QW transistor can be formed further including: a source 302 and a drain 303 formed on the fin part at both sides of the gate structure 210; a sidewall spacer 208 located on both sidewalls of the gate structure 210 and on surface of the source 302 and the drain 303; and a metal electrode 304 on each surface of the source 302 and drain 303.

For example, the source 302 and the drain 303 can be N-type doped including, e.g., N-doped GaN. The metal electrode 304 on surface of the source 302 and drain 303 can be made of a material including, e.g., NiAu and/or CrAu. The metal electrode can reduce a contact resistance of the source and the drain.

As disclosed, the 3D WQ transistor can have a channel region between a source 302 and a drain 303. The channel region can have a width the same as the gate structure 210. No extended region from the channel region under the sidewall spacer 208, which can effectively increase electron density in the channel region with reduced resistance of the channel region and with improved source-drain current.

As disclosed, 3D-QW transistors can be formed on the fin part 201. The gate structure can be formed having a sufficient contact area with the fin part to effectively improve an area of the channel region of the transistor and to improve a gate length of the gate structure. Transistor performance can thus be improved and heat dissipation efficiency of the transistor can be improved. In addition, insulting materials such as AlN can be used as the fin part. The exemplary AlN material can have a thermal conductivity of about 3.4 W/cmK, which has two orders of magnitude higher than the conventionally used silicon oxide. The use of the fin part as an isolation medium can facilitate heat transfer from the transistors configured on the semiconductor substrate to the semiconductor substrate to improve stability of the 3D-QW transistor.

Figure 22:
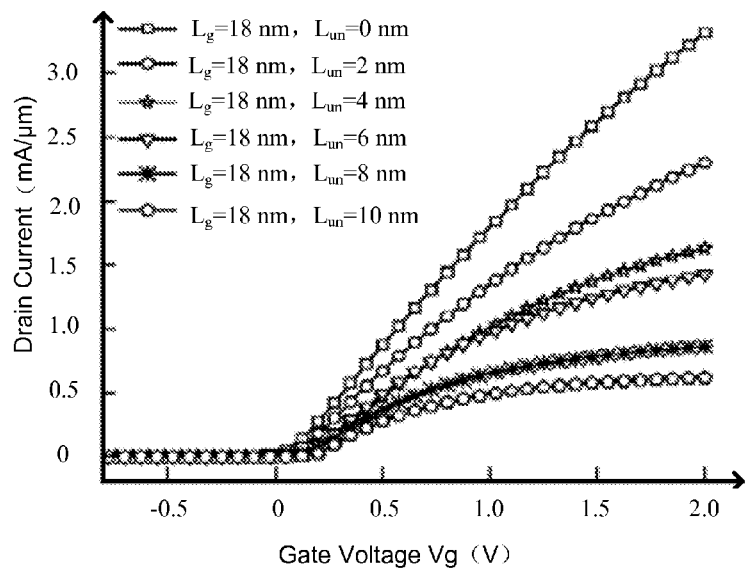
FIG. 22 depicts a relationship between a drain current and a gate voltage for a transistor.

FIG. 22 depicts a relationship between a drain current and a gate voltage of a transistor having different underlap gate lengths.

In this example, a width of the fixed gate structure 210 $L_g$ is about 18 nm, the extended region of the channel region located under the sidewall spacer 208 can have a width $L_{un}$ of about 0 nm, 2 nm, 4 nm, 6 nm, 8 nm, and 10 nm respectively. As indicted by FIG. 22, under a same gate voltage, as the width $L_{un}$ of the extended region of the channel region located under the sidewall spacer 208 decreases, the drain current increases.

Therefore, removal of extended region of the channel region located under the sidewall spacer 208 on both sides of the gate structure 210 can allow a same width for the channel region and the gate structure of the transistor to significantly reduce resistance of the channel region of the 3D-QW transistor and to improve the source-drain current.

In a particular embodiment, a non-planar III/V quantum well device with AlN for isolation can be formed on a silicon substrate. The AlN with enhanced thermal dissipation compared with GaN, InGaN or AlGaN can be used for buffer layer and thus for the fin part. The source and drain regions of the transistor can be formed by etching and re-growing 100-nm-GaN regions with silicon doping to provide a high n-type conduction. Exemplary AlInN barrier/GaN quantum well/AlN buffer structure can be etched to form the device source and drain recess regions and leave AlN buffer layer partially etched. Doped GaN can be re-grown on the source and drain recess regions to form the source/drain. No STI structures are needed for device isolation.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a transistor comprising:
   providing a semiconductor substrate;
   forming a buffer layer on the semiconductor substrate;
   forming a fin part by etching the buffer layer, wherein the fin part is formed of an insulating material;
   forming an insulating layer on the semiconductor substrate, the insulating layer having a top surface lower than a top surface of the fin part;
   forming a quantum well (QW) layer on surface of the fin part;
   forming a barrier layer on surface of the QW layer;
   forming a gate structure on the barrier layer across the fin part and on the insulating layer, the gate structure including a gate dielectric layer on each of the insulating layer and the barrier layer, and a gate electrode on the gate dielectric layer;
   forming a sidewall spacer on both sidewalls of the gate structure;
   forming a recess in the fin part on both sides of the gate structure to suspend the sidewall spacer; and
   forming a source and a drain by growing an epitaxial material in the recess, each of the source and the drain including a side edge aligned with a sidewall edge of the gate structure such that a channel region in the QW layer under the gate structure having a same width with the gate structure and the channel region does not extend to under the sidewall spacer.

2. The method according to claim 1, where forming the recess to suspend the sidewall spacer includes:
   using the gate structure and the sidewall spacer as a mask to dry etch the barrier layer, the QW layer, and the fin part; and
   using a wet etching process to remove a portion of each of the barrier layer, the QW layer, and the fin part, under the sidewall spacer to suspend the sidewall spacer.

3. The method according to claim 1, wherein the buffer layer is formed on a crystal plane (111) of the semiconductor substrate.

4. The method according to claim 1, wherein the buffer layer is made of a material including AlN, and the buffer layer has a thickness ranging from about 1 micron to 2 microns.

5. The method according to claim 1, wherein the QW layer is made of a material including a compound selected from group III-V and group II-VI.

6. The method according to claim 1, wherein the QW layer is made of a material including GaN, AlGaN, InGaN, or Ge, and the QW layer has a thickness ranging from about 10 nm to 100 nm.

7. The method according to claim 1, wherein the barrier layer is made of a material including a compound selected from group III-V and group II-VI.

8. The method according to claim 1, wherein the barrier layer is made of a material including AlN, AlGaN, or AlInN, and the barrier layer has a thickness ranging from about 1 nm to 10 nm.

9. The method according to claim 1, wherein, prior to forming the gate structure, a capping layer is formed on the barrier layer, and wherein the capping layer has a thickness ranging from about 1 nm to 3 nm and is made of a material including GaN.

10. The method according to claim 1, wherein each of the source and the drain is made of a material including N-doped GaN.

11. The method according to claim 1, further including forming a metal electrode on each of the source and the drain, wherein the metal electrode is made of a material including NiAu or CrAu.

* * * * *